(12) United States Patent
Radosavljevic et al.

(10) Patent No.: US 11,527,610 B2
(45) Date of Patent: Dec. 13, 2022

(54) CMOS COMPATIBLE ISOLATION LEAKAGE IMPROVEMENTS IN GALLIUM NITRIDE TRANSISTORS

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1042 days.

(21) Appl. No.: 16/000,714

(22) Filed: Jun. 5, 2018

(65) Prior Publication Data

US 2019/0371886 A1 Dec. 5, 2019

(51) Int. Cl.
*H01L 29/06* (2006.01)
*H01L 29/20* (2006.01)
(Continued)

(52) U.S. Cl.
CPC ...... *H01L 29/0653* (2013.01); *H01L 21/0254* (2013.01); *H01L 21/02178* (2013.01); *H01L 21/02181* (2013.01); *H01L 21/02381* (2013.01); *H01L 21/30612* (2013.01); *H01L 21/31053* (2013.01); *H01L 21/76224* (2013.01);
(Continued)

(58) Field of Classification Search
CPC ............ H01L 29/2003; H01L 21/0254; H01L 29/7783; H01L 27/0629; H01L 29/7787; H01L 29/7786; H01L 29/66462; H01L 29/205; H01L 29/0649; H01L 21/76224; H01L 21/823481; H01L 29/0653; H01L 21/823878; H01L 21/76283
See application file for complete search history.

(56) References Cited

U.S. PATENT DOCUMENTS 6,657,276 B1 * 12/2003 Karlsson ............ H01L 29/7842
438/424
2013/0277683 A1 10/2013 Then et al.
(Continued)

FOREIGN PATENT DOCUMENTS

WO WO-201 6209263 12/2016
WO WO-2016209263 12/2016
(Continued)

OTHER PUBLICATIONS

Radosavljevic, Marko et al., "Contact Shape Engineering for Improved Performance in GAN RF Transistors", U.S. Appl. No. 16/001,791, filed Jun. 6, 2018, 35 pgs.

*Primary Examiner* — John A Bodnar
(74) *Attorney, Agent, or Firm* — Schwabe, Williamson & Wyatt, P.C.

(57) ABSTRACT

An integrated circuit structure comprises a silicon substrate and a III-nitride (III-N) substrate over the silicon substrate. A first III-N transistor and a second III-N transistor is on the III-N substrate. An insulator structure is formed in the III-N substrate between the first III-N transistor and the second III-N, wherein the insulator structure comprises one of: a shallow trench filled with an oxide, nitride or low-K dielectric; or a first gap adjacent to the first III-N transistor and a second gap adjacent to the second III-N transistor.

13 Claims, 13 Drawing Sheets

(51) Int. Cl.
| | |
|---|---|
| *H01L 27/088* | (2006.01) |
| *H01L 29/08* | (2006.01) |
| *H01L 29/66* | (2006.01) |
| *H01L 21/02* | (2006.01) |
| *H01L 21/762* | (2006.01) |
| *H01L 21/3105* | (2006.01) |
| *H01L 21/306* | (2006.01) |
| *H01L 27/06* | (2006.01) |
| *H01L 29/205* | (2006.01) |
| *H01L 21/8252* | (2006.01) |
| *H01L 29/778* | (2006.01) |

(52) U.S. Cl.
CPC ...... *H01L 21/8252* (2013.01); *H01L 27/0605* (2013.01); *H01L 27/088* (2013.01); *H01L 29/0847* (2013.01); *H01L 29/2003* (2013.01); *H01L 29/205* (2013.01); *H01L 29/6656* (2013.01); *H01L 29/66462* (2013.01); *H01L 29/66545* (2013.01); *H01L 29/7787* (2013.01)

(56) References Cited

U.S. PATENT DOCUMENTS

| | | | | |
|---|---|---|---|---|
| 2014/0131720 | A1* | 5/2014 | Hsiung | H01L 29/66462 438/285 |
| 2014/0151637 | A1* | 6/2014 | Xiao | H01L 29/66462 257/24 |
| 2017/0194318 | A1* | 7/2017 | Balakrishnan | H01L 29/66545 |

FOREIGN PATENT DOCUMENTS

| | | |
|---|---|---|
| WO | WO-2016209282 | 12/2016 |
| WO | WO-2017111892 | 6/2017 |
| WO | WO-2018063160 | 4/2018 |
| WO | WO-2018063409 | 4/2018 |

* cited by examiner

CMOS COMPATIBLE ISOLATION LEAKAGE IMPROVEMENTS IN GALLIUM NITRIDE TRANSISTORS

TECHNICAL FIELD

Embodiments of the disclosure are in the field of integrated circuit structures and, in particular, CMOS compatible isolation leakage improvements in gallium nitride (GaN) transistors.

BACKGROUND

Systems on a chip (SOC) have been implemented in a number of capacities over the last few decades. SOC solutions offer the advantage of scaling which cannot be matched by board-level component integration. While analog and digital circuits have long been integrated onto a same substrate to provide a form of SOC that provides mixed signal capabilities, SOC solutions for mobile computing platforms, such as smart phones and tablets, remain elusive because these devices typically include components which operate with two or more of high voltage, high power, and high frequency. As such, conventional mobile computing platforms typically utilize group III-V compound semiconductors, such a GaAs heterojunction bipolar transistors (HBTs), to generate sufficient power amplification at GHz carrier frequencies, and laterally diffused silicon MOS (LD-MOS) technology to manage voltage conversion and power distribution (battery voltage regulation including step-up and/or step-down voltage conversion, etc.). Conventional silicon field effect transistors implementing CMOS technology is then a third device technology utilized for logic and control functions within a mobile computing platform.

The plurality of transistor technologies utilized in a mobile computing platform limits scalability of the device as a whole and is therefore a barrier to greater functionality, higher levels of integration, lower costs, and smaller form factors, etc. While an SOC solution for the mobile computing space that would integrate two or more of these three device technologies is therefore attractive, one barrier to an SOC solution is the lack of a scalable transistor technology having both sufficient speed (i.e., sufficiently high gain cutoff frequency, $F_t$), and sufficiently high breakdown voltage (BV).

One promising transistor technology is based on group III-nitrides (III-N). However, this transistor technology faces fundamental difficulties in scaling to feature sizes (e.g., gate length) less than 100 nm where parasitic capacitance between adjacent III-N transistors due to their proximity to each other becomes difficult to control. Previous university research techniques isolate adjacent III-N transistors using only a space filled with air, with no material intentionally deposited between the adjacent devices. However, materials are required between adjacent transistors to fabricate complex integrated circuits in which a flat surface is desired between each subsequent layer.

DESCRIPTION OF THE EMBODIMENTS

Figure 1A:
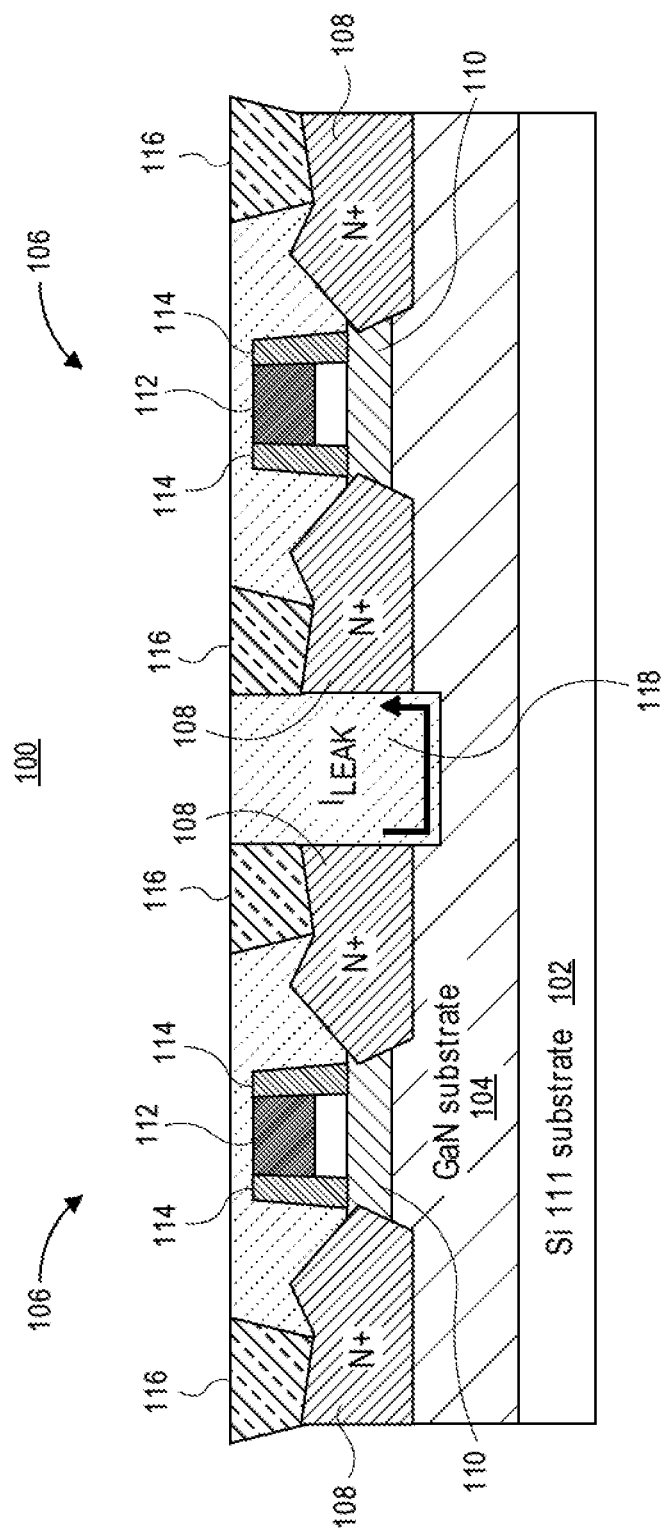
FIGS. 1A and 1B are cross-sectional illustrations of an integrated circuit structure comprising a pair of adjacent III-N transistors in accordance with an embodiment.

CMOS compatible isolation leakage improvements in gallium nitride (GaN) transistors are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating III-N transistors, such as gallium nitride (GaN) transistors having improved isolation leakage in a manner that is CMOS compatible. Embodiments may include or pertain to one or more of III-V transistors, GaN transistors, isolation structures, shallow trench, air-gap, and system-on-chip (SoC) technologies and RF filters. One or more embodiments may be implemented to realize high performance backend transistors to potentially increase monolithic integration of backend logic plus memory in SoCs of future technology nodes.

Figure 1B:
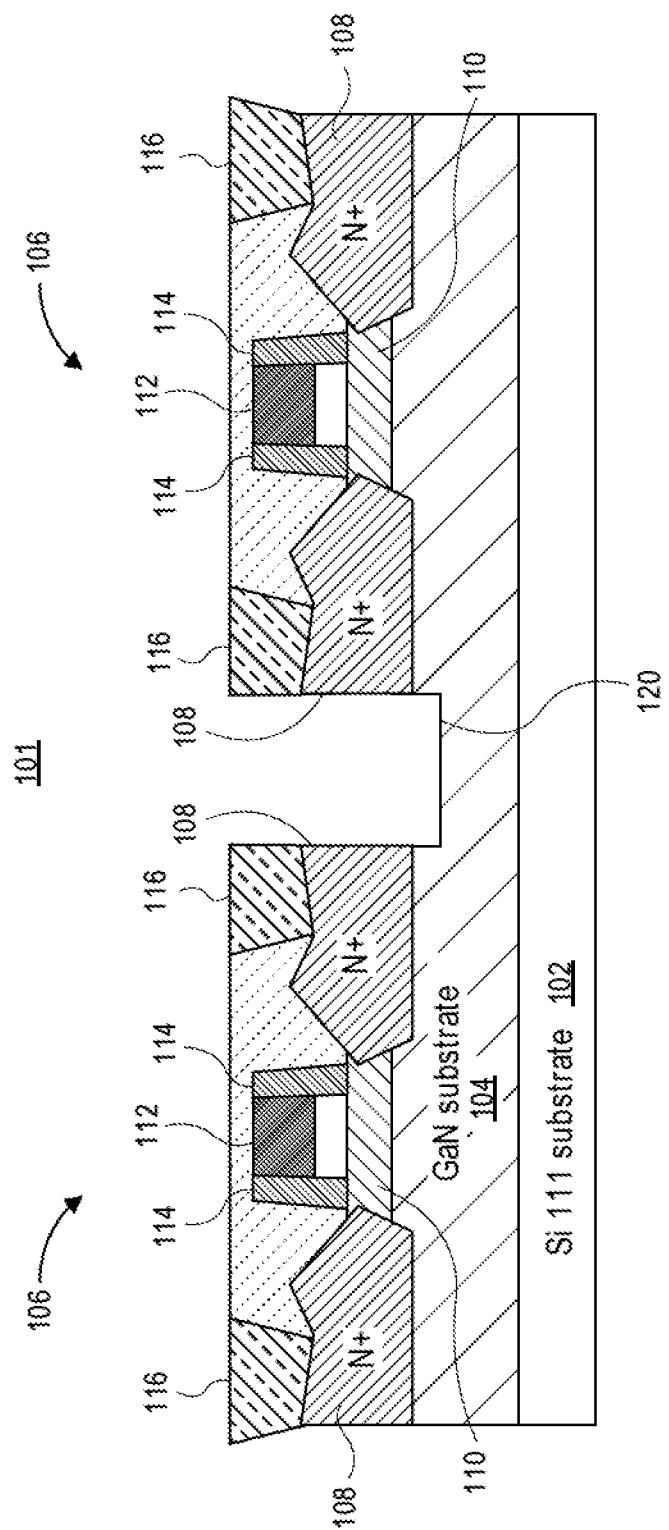

To provide context, FIGS. 1A and 1B are cross-sectional illustrations of an integrated circuit structure comprising a pair of adjacent III-N transistors in accordance with an embodiment. In one embodiment, a base of the integrated circuit structure 100 includes a silicon substrate 102 and a III-nitride (III-N) substrate 104 over the silicon substrate 102. A pair of III-N transistors, such as GaN transistors 106, may each comprise source and drain (S/D) regions 108, a polarization layer 110 between the S/D regions 108, and a gate electrode 112 over the polarization layer 110. In one embodiment, spacers 114 may be located on either side of the gate electrode 112. Metallization or contacts 116 may be formed on the respective S/D regions 108.

As shown in FIG. 1A, as the GaN transistors 106 are scaled to feature sizes (e.g., gate length) less than 100 nm and are separated only by a dielectric material 118, parasitic capacitance ($I_{Leak}$) may be induced between the adjacent GaN transistors 106 due to their proximity, which can be difficult to control.

FIG. 1B shows another embodiment of integrated circuit structure 101 that replaces the dielectric material 118 from FIG. 1A with a space 120 filled with air to isolate adjacent GaN transistors 106, with no other material intentionally deposited between the adjacent devices. However, this does not appear to be a viable solution as in order to fabricate vertically complex integrated circuits, a flat surface is required of each layer to fabricate each subsequent layer. The spaces 120 between the GaN transistors 106 create holes in the device layer that preclude the device layer from having a flat surface.

In accordance with one or more embodiments described herein, III-N transistors are described having CMOS compatible isolation structures. Embodiments described herein may include insulation structures between III-N transistors that effectively decrease parasitic capacitance between the transistors. In one embodiment described herein, the insulator structures are located partially in the III-N substrate and in a dielectric between the adjacent III-N transistors. The insulator structures are formed according to two embodiments. In one embodiment, the insulator structure comprises a shallow trench filled with an oxide, nitride or low-K dielectric, or optionally, a bilayer stack that includes the oxide, nitride or low-K dielectric and a high-K liner. In a second embodiment, the insulator structure comprises at least two gaps in the III-N substrate and the dielectric material, where the first gap is in contact with the first III-N transistor and a second gap is in contact with the second III-N transistor. In one embodiment the gaps may comprise an air-gap, but can include a gap filled with any other suitable gas, dielectric, and/or liquid.

Figure 2A:
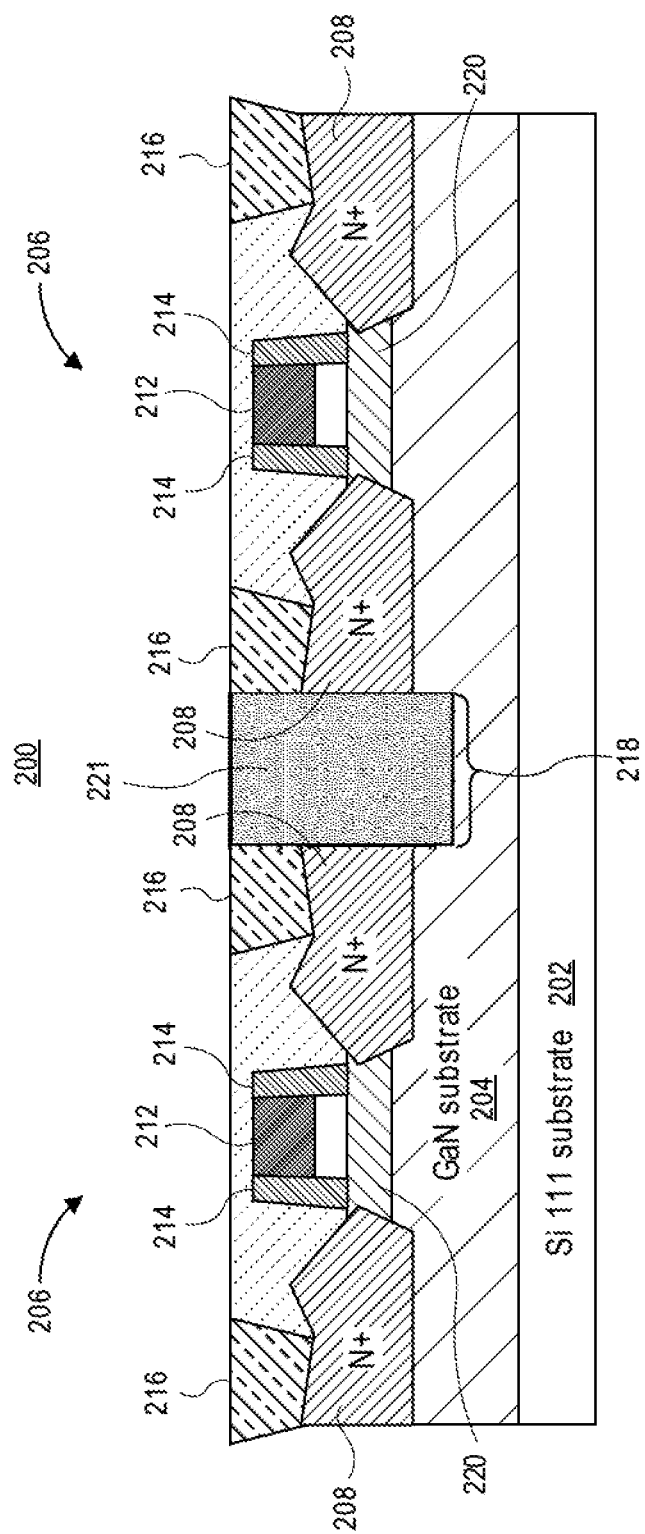
FIGS. 2A and 2B are cross-sectional illustrations of an integrated circuit structure comprising a pair of adjacent III-N transistors with an improved insulator structure in accordance with the first embodiment.
Figure 2B:
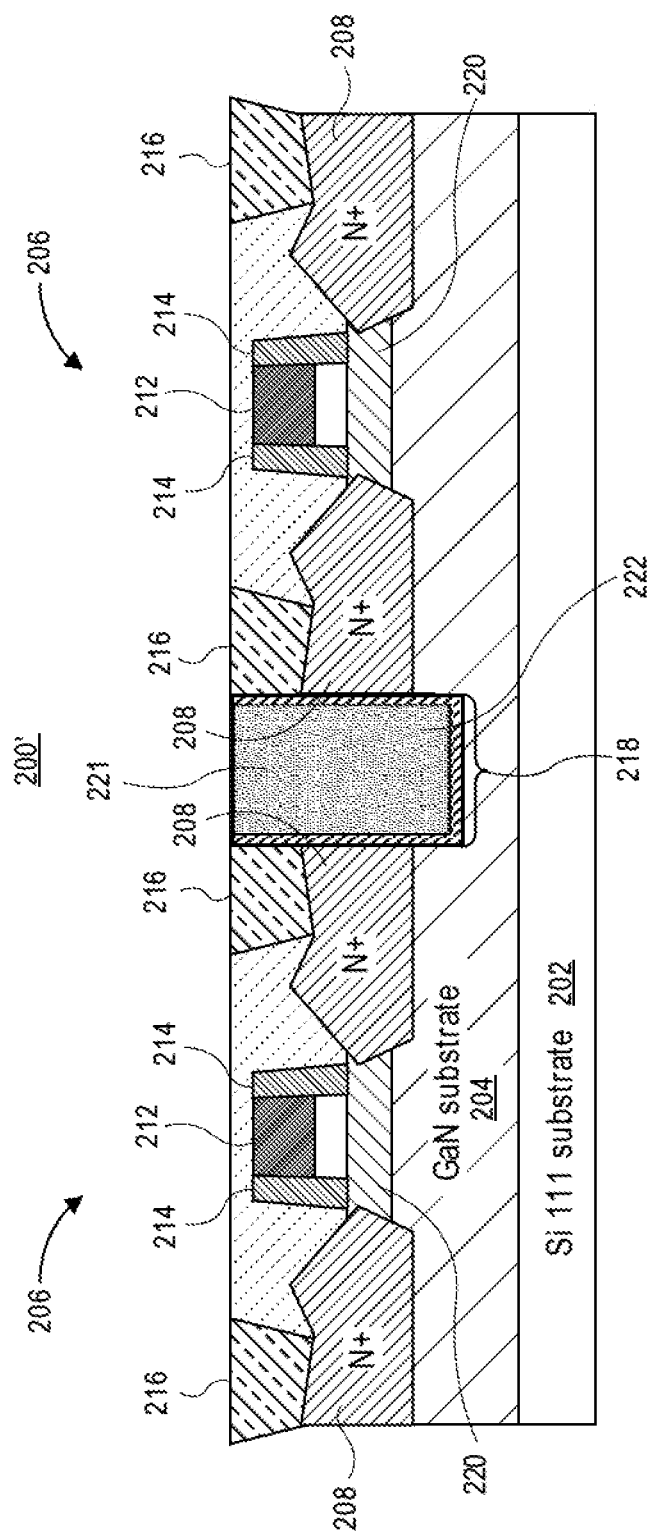

FIGS. 2A and 2B are cross-sectional illustrations of an integrated circuit structure comprising a pair of adjacent III-N transistors with an improved insulator structure in accordance with the first embodiment. Similar to FIGS. 1A and 1B, a base of the integrated circuit structure 200 includes a silicon substrate 202 and a III-nitride (III-N) substrate 204 over the silicon substrate 202. The III-N transistors 206 may each comprise source and drain (S/D) regions 208, a polarization layer 220 on the III-N substrate 204 between the (S/D) 208, and a gate electrode 212 over the polarization layer 220. In one embodiment, spacers 214 may be located on either side of the gate electrode 212. Metal contacts 216 may be formed on the respective (S/D) regions 208. It should be understood that a GaN channel (not shown) under the polarization layer 220 may be part of a GaN substrate 204. In one embodiment, the III-N transistors 206 may comprise III-N semiconductor materials such as gallium nitride (GaN), indium nitride (InN), aluminum nitride (AlN), and compounds thereof.

In order to increase the surface area of the interface between the contacts 216 and the S/D regions 208, the S/D regions 208 may be formed with a nonplanar or a roughened surface as shown. A nonplanar or roughened surface produces non-horizontal surfaces within the footprint of the S/D contact 208. As used herein, a "non-horizontal surface" is a surface that is not parallel to a major or primary surface of the underlying GaN substrate 204. The inclusion of non-horizontal surfaces provides additional surface area for the interface without needing to expand the footprint. As used herein, a roughened surface may refer to a surface that is non-polished (e.g., with a chemical mechanical planarization (CMP) process).

In accordance with the first embodiment and as shown in FIG. 2A, the III-N transistors 206 are separated by an insulator structure comprising a shallow trench 218 filled with a material 221. As shown, the shallow trench 218 is formed across the entire span between the III-N transistors 206 such that sides of the respective source and drain regions 208 of the first and second III-N transistors form sidewalls of the shallow trench 218. In one embodiment, the width of the shallow trench may be approximately 300 nm to several microns. Because the material 221 is in contact with the sidewalls of the transistors 206, a material 221 is selected that is compatible with gallium nitride. Compatibility in this context means that the material 221 creates a good interface with a gallium nitride so that little to no charges formed at the interface between the two either due to a fixed charging material or the interaction between the material 221 and the gallium nitride. In one embodiment, the material 221 filling the trench may comprise any oxide or nitride, or low-K dielectric, and examples may include C-doped SiOx, SiN, and the like, however note that low-K dielectrics are more relevant due to capacitance penalty.

In an embodiment, the trench 218 is filled such that the material 221 is coplanar with a top of the metal contacts 216 on the respective source and drain regions 208 of the III-N transistors 206 to create a flat surface over the transistors III-N 206.

As shown in FIG. 2B, in another embodiment, the shallow trench 218 may be filled with a bi-layer stack comprising a high-K dielectric liner 222 formed on the sidewalls and a bottom of the shallow trench 218, and the material 221, such as an oxide, nitride or low-K dielectric, formed on the layer of high-K dielectric liner 222 to fill a remainder of the shallow trench 218. In one embodiment, the high-K dielectric liner 222 may comprise one of aluminum oxide and hafnium oxide. In one embodiment, the high-K dielectric liner 222 is approximately 2 nm in thickness.

In both the embodiments shown in FIGS. 2A and 2B the shallow trench is approximately 200 nm to 500 nm in height, but in one embodiment does not reach a depth of the Si substrate 202.

Figure 3:
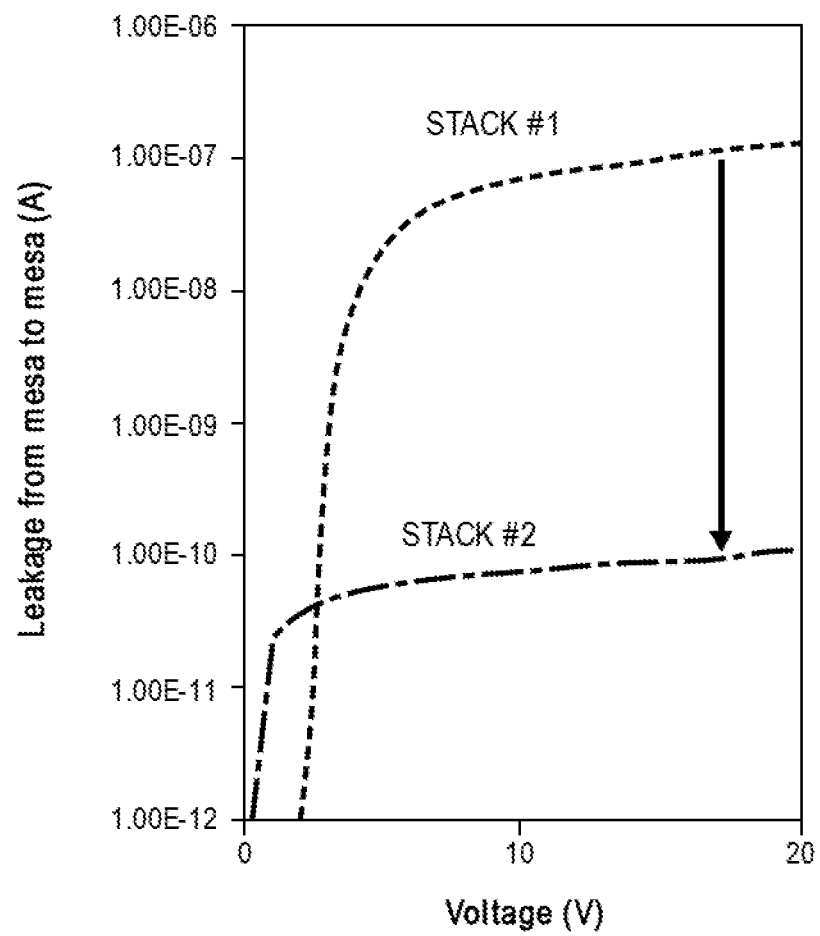
FIG. 3 is a graph illustrating leakage improvement between a structure comprising a trench filled with standard materials.

FIG. 3 is a graph illustrating leakage improvement between a structure comprising a trench filled with standard materials, such as Al2O3 (stack #1) versus a shallow trench filled with the silicon nitride/silicon oxide (stack #2) of the present embodiments. The y-axis is leakage from mesa to mesa in volts and the x-axis is the current. As shown a stack #1 with conventional materials results in leakage of 1.00E-07, while stack #2 reduces the leakage to approximately 1.00E-11. Since the scale is logarithmic, the reduction in leakage provided by the trench filled with silicon oxide, for example, is significant.

Figure 4:
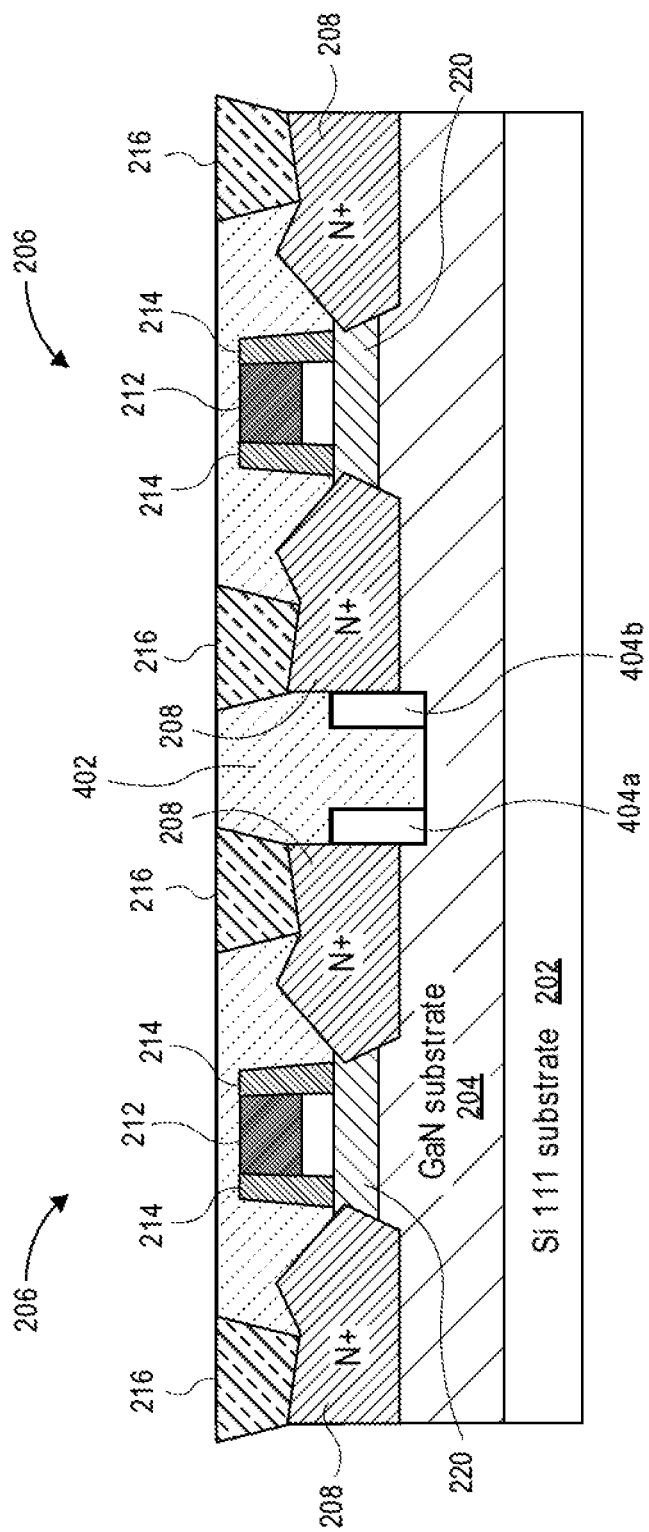
FIG. 4 is a cross-sectional illustration of an integrated circuit structure comprising a pair of adjacent III-N transistors with an improved insulator structure in accordance with the second embodiment.

FIG. 4 is a cross-sectional illustration of an integrated circuit structure comprising a pair of adjacent III-N transistors with an improved insulator structure in accordance with the second embodiment, where like components of FIG. 2A have like reference numerals. Similar to FIG. 2A, the base of the integrated circuit structure 400 includes a silicon substrate 202 and a III-nitride (III-N) substrate 204 over the silicon substrate 202. A pair of III-N transistors, such as GaN transistors 206, may each comprise source and drain S/D regions 208, a polarization layer 120 on the III-N substrate 204 between the S/D 208, and a gate electrode 212 over the polarization layer 120. In one embodiment, spacers 214 may be located on either side of the gate electrode 212. Metal contacts 216 may be formed on the respective S/D regions 208.

In accordance with the second embodiment and as shown in FIG. 4, the III-N transistors 206 are separated by an insulator structure comprising at least two gaps, a first gap 404a adjacent to the first III-N transistor and a second gap 404b (collectively referred to as gaps 404) adjacent to the second III-N transistor 206. In one embodiment, the first gap 404a is in physical contact with the first III-N transistor and the second gap 404b is in contact with the second III-N transistor. The insulator structure includes an interlayer dielectric (ILD) 402 between the first and second III-N transistors 206. The ILD 402 may also cover the gate electrodes and spacers 214 between the metal contacts 216 of the III-N transistors 206.

The first and second gaps 404a and 404b are formed partially in the III-N substrate 204 and partially in the ILD 402. More specifically, in one embodiment the first gap 404a and the second gap 404b have respective top portions and bottom portions, wherein the top portions are located in the ILD 402 at approximately ½ a height of the respective source and drain regions 208 of the first and second III-N transistors 206, and the bottom portions are located in the III-N substrate 204 at approximately one half the depth of the III-N substrate 204 such that the bottom portions do not contact the silicon substrate 202. As shown the first and second gaps 404a and 404b are formed as an opening with borders defined by the ILD 402 along the top portion and along a first side; bordered by the III-N substrate 204 along the bottom portions; and bordered by both the source and drain region 208 and the III-N substrate 204 along a second side.

The gaps 404 can include, for example, an air-gap, but can include a gap filled with any other suitable gas, dielectric, and/or liquid. As mentioned, in various embodiments, the presence of the gap 404 can reduce parasitic capacitance thereby increase performance of the first and second III-N transistors 206.

FIGS. 5A-5G are diagrams illustrating cross-sectional views showing the fabrication of a pair of III-N transistors having a shallow trench isolation structure in accordance with the first embodiment. As will be apparent in light of the structures formed, the process discloses techniques for III-N transistors isolation. Various transistor geometries can benefit from the techniques described herein, including, but not limited to, HEMT, pHEMT, transistors employing 2DEG architecture, transistors employing 3DEG (or 3D polarization FET) architecture, transistors employing multiple quantum-wells (MQW) or super-lattice architecture. In addition, the techniques may be used to form CMOS transistors/devices/circuits, where the III-N materials, such as GaN, transistor structures variously described herein are used for the n-MOS transistors of the CMOS, for example.

Figure 5A:
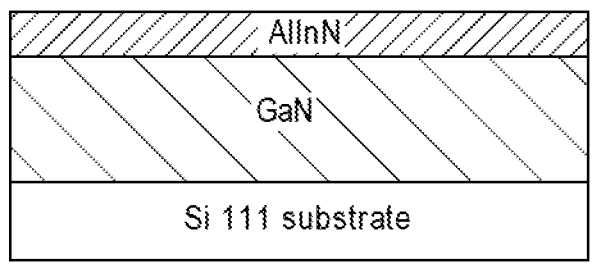
FIGS. 5A-5G are diagrams illustrating cross-sectional views showing the fabrication of a pair of III-N transistors having a shallow trench isolation structure in accordance with the first embodiment.

FIG. 5A illustrates the fabrication process after a GaN layer is formed on epitaxial through growth, and a polarization layer is formed on the GaN layer. In some embodiments, substrate may be a bulk substrate of Si, SiGe, or Ge. The polarization layer can include aluminum and a nitride alloy, such as aluminum indium nitride ($Al_xIni_{-x}N$) or aluminum gallium nitride ($Al_xGai_{-x}N$). Part of the polarization layer can include an intermediate layer of aluminum nitride (AlN) that can be deposited on the GaN layer to help facilitate the formation of the remainder of the polarization layer and to further support mobility in the resulting channel. A conductive channel will be formed at the interface of the polarization layer and the GaN layer. Formation of the GaN layer and the polarization layer may include any suitable techniques, such as growing the GaN layer and the polarization layer in a metal-organic chemical vapor deposition (MOCVD) chamber or any other suitable deposition process.

Figure 5B:
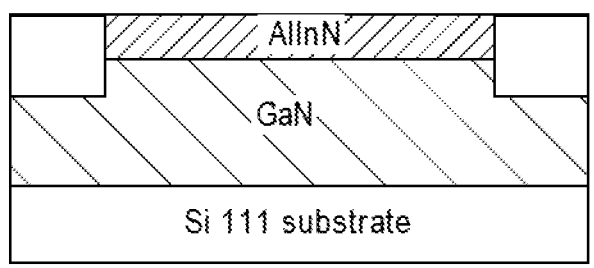

FIG. 5B illustrates the fabrication process after shallow trench isolation (STI) is performed in which the polarization layer and the GaN layer are etched to define locations for the isolation areas and adjacent source and drain regions. The trenches isolate polarization portion from other portions of the polarization layer. As described below, the source and drain regions can be formed adjacent to the trenches. The removal of portions of the polarization layer results in an isolated conductive channel.

Figure 5C:
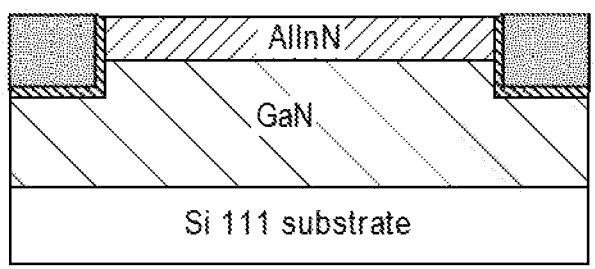

FIG. 5C illustrates the fabrication process after STI fill and polish is performed in which the trenches are filled with a dielectric material, such as silicon oxide, or optionally first lined with a high-K material and then filled with an oxide, followed by removal of the excess dielectric using a technique such as chemical-mechanical planarization (CMP). In one embodiment, the high-K dielectric liner may comprises one of aluminum oxide and hafnium oxide.

Figure 5D:
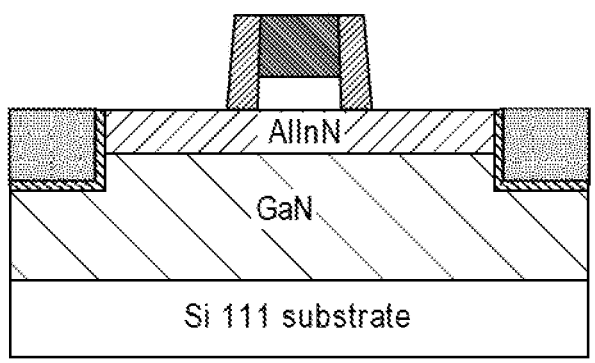

FIG. 5D illustrates the fabrication process after formation of a dummy gate formed by deposition of a dummy gate oxide, a dummy gate electrode (e.g., poly-Si) and spacers on each side of the dummy gate electrode.

Figure 5E:
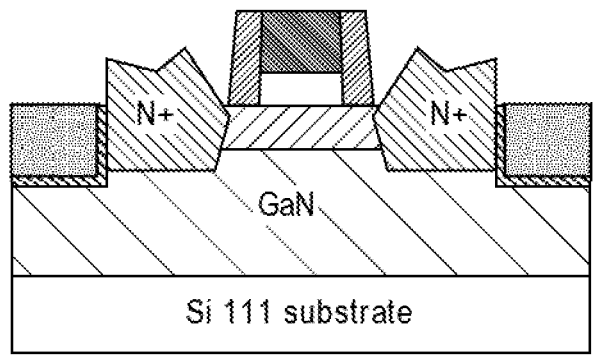

FIG. 5E illustrates the fabrication process after source and drain S/D regions are formed adjacent to the trenches by masking the structure of FIG. 5D and etching to remove polarization layer in the S/D regions, followed by epitaxial regrowth of n-type S/D material. For example, the material may be indium gallium nitride (InGaN) doped with Si to form n-type S/D regions. In some embodiments, the S/D material may be n-type doped gallium nitride, n-type doped indium gallium nitride with a graded indium composition, or any other suitable material.

Figure 5F:
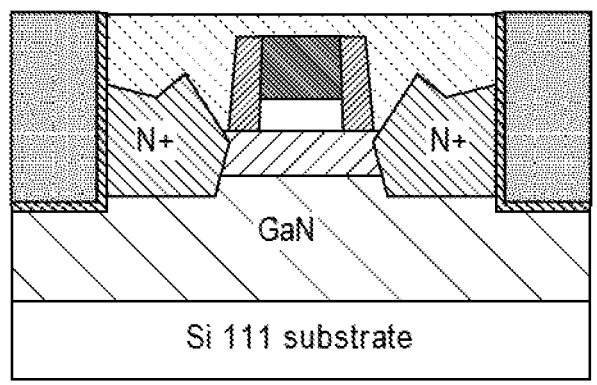

FIG. 5F illustrates the fabrication process after an interlayer dielectric (ILD) is deposited and planarized, e.g., to a top of the dummy gate electrode or to a top of the current device level, and additional dielectric material from FIG. 5C is added to the trenches.

Figure 5G:
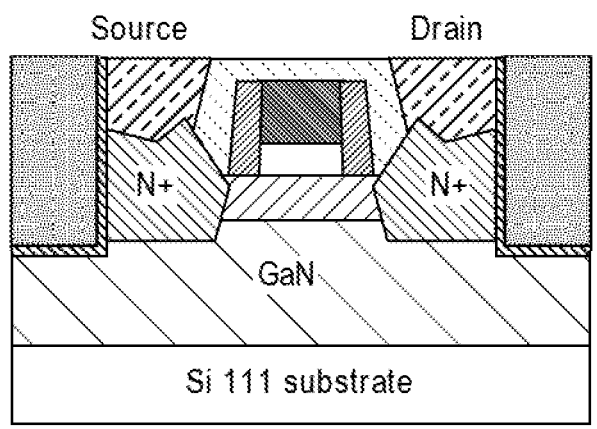

FIG. 5G illustrates the fabrication process after a replacement metal gate (RMG) process in which the dummy gate electrode and gate oxide are removed to expose the channel region of the transistors and a gate dielectric and a replacement metal gate, respectively, are formed in the exposed channel region. FIG. 5G also shows the process after the ILD is etched to form holes and metal contacts (e.g., M0)

formed in the holes in contact with the S/D regions, completing the process. In one embodiment the metal contacts may comprise tungsten or any other suitable conductive material.

Other embodiments may include a standard gate stack formed by any suitable process, such as a subtractive process where the gate dielectric/gate metal is deposited and then followed by one or more etching processes. Any number of standard back-end processes may also be performed to help complete the formation of one or more transistors.

Isolating adjacent III-N transistors with a shallow trench isolation structure filled with an oxide, nitride or low-K material with without a high-K liner in a manner above relies on CMOS compatible flows as well as engineering of appropriate materials to passivate III-N sidewalls and reduce leakage through those interfaces. The approach may be used in modern silicon 300 millimeter semiconductor fabrication plants. The process provides ready integration of III-N devices with silicon CMOS.

FIGS. 6A-6F are diagrams illustrating cross-sectional views showing the fabrication of a pair of III-N transistors separated by an isolation structure comprising at least two gaps in the III-N substrate and the dielectric material separating the two transistors in accordance with the second embodiment. As will be apparent in light of the structures formed, the process discloses techniques for III-N transistors isolation. Various transistor geometries can benefit from the techniques described herein, including, but not limited to, HEMT, pHEMT, transistors employing 2DEG architecture, transistors employing 3DEG (or 3D polarization FET) architecture, transistors employing multiple quantum-wells (MQW) or super-lattice architecture. In addition, the techniques may be used to form CMOS transistors/devices/circuits, where the III-N materials, such as GaN, transistor structures variously described herein are used for the n-MOS transistors of the CMOS, for example.

Figure 6A:
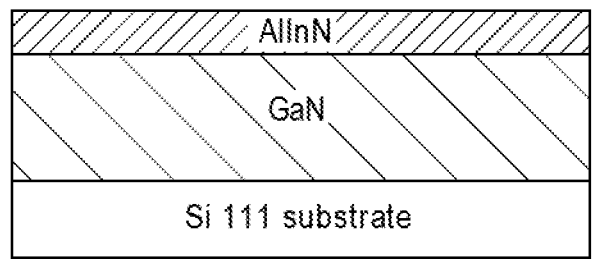
FIGS. 6A-6F are diagrams illustrating cross-sectional views showing the fabrication of a pair of III-N transistors separated by an isolation structure comprising at least two gaps in the III-N substrate and the dielectric material separating the two transistors in accordance with the second embodiment.

FIG. 6A illustrates the fabrication process after a GaN layer is epitaxially grown on a Si substrate, and a polarization layer is formed on the GaN layer. In some embodiments, substrate may be a bulk substrate of Si, SiGe, or Ge. The polarization layer can include aluminum+nitride alloy, such as aluminum indium nitride ($Al_xIn_{1-x}N$) or aluminum gallium nitride ($Al_xGa_{1-x}N$). Part of the polarization layer can include an intermediate layer of aluminum nitride (AlN) that can be deposited on the GaN layer to help facilitate the formation of the remainder of the polarization layer and to further support mobility in the resulting channel. A conductive channel will be formed at the interface of the polarization layer and the GaN layer. Formation of the GaN layer and the polarization layer may include any suitable techniques, such as growing the GaN layer and the polarization layer in a metal-organic chemical vapor deposition (MOCVD) chamber or any other suitable deposition process.

Figure 6B:
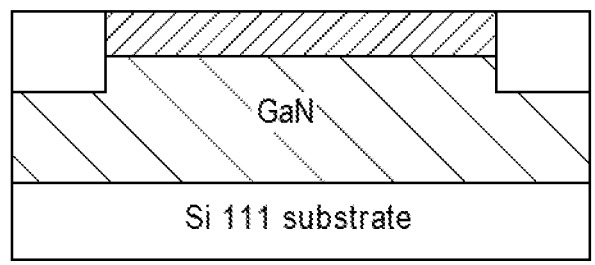

FIG. 6B illustrates the fabrication process after shallow trench isolation (STI) is performed in which the polarization layer and the GaN layer are etched to define locations for the isolation areas and adjacent source and drain regions. The trenches isolate polarization portion from other portions of the polarization layer. As described below, the source and drain regions can be formed adjacent to the trenches. The removal of portions of the polarization layer results in an isolated conductive channel.

Figure 6C:
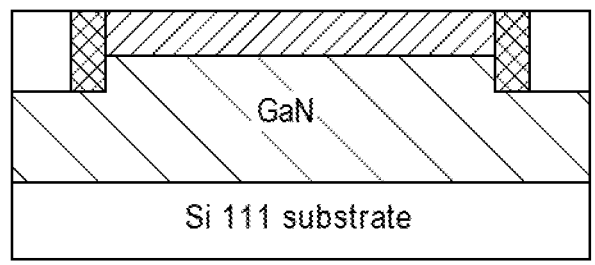

FIG. 6C illustrates the fabrication process after a sacrificial layer is formed and etched to form spacers on a sidewalls of the trenches.

Figure 6D:
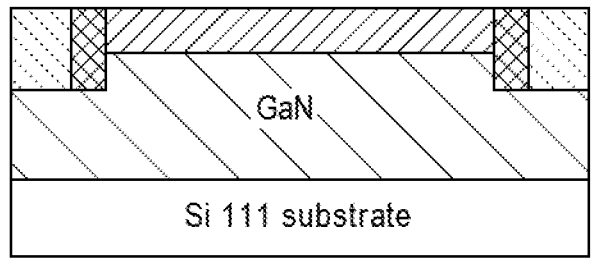

FIG. 6D illustrates the fabrication process after STI fill and polish is performed in which a remainder of the trenches is filled with a dielectric material followed by removal of the excess dielectric using a technique such as chemical-mechanical planarization (CMP).

Figure 6E:
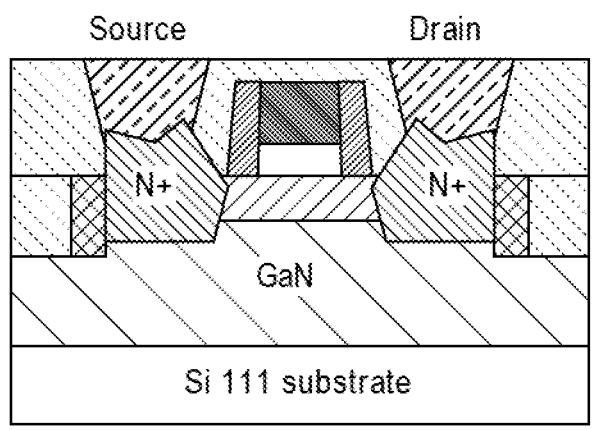

FIG. 6E illustrates the fabrication process after completion of the GaN transistor to metal layer M0. Completion of the GaN transistor to M0 may include forming the source and drain S/D regions by masking the structure of FIG. 6D and etching to remove polarization layer in the S/D regions, followed by epitaxial regrowth of n-type S/D material; formation of a dummy gate; forming and planarizing an interlayer dielectric (ILD); removing the dummy gate electrode to expose a channel region and forming a replacement metal gate over the exposed channel region; and formation of metal contacts (e.g., M0) in contact with the S/D regions.

Figure 6F:
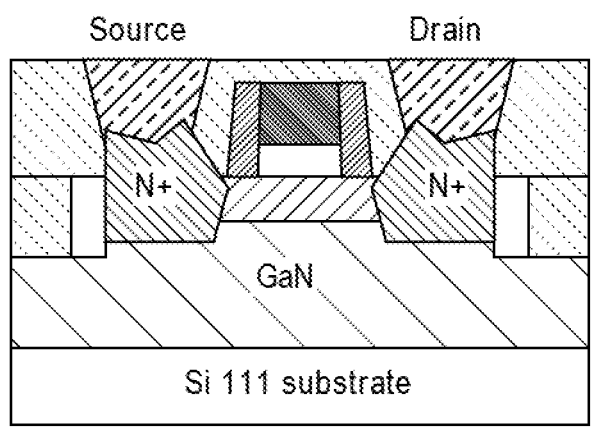

FIG. 6F illustrates the fabrication process after the spacers are etched from the sidewalls of the trenches to reveal respective air-gaps on each side of the GaN transistor. In one embodiment, the air-gaps may be filled in with any suitable gas and/or liquid, or left with air only.

Other embodiments may include a standard gate stack formed by any suitable process, such as a subtractive process where the gate dielectric/gate metal is deposited and then followed by one or more etching processes. Any number of standard back-end processes may also be performed to help complete the formation of one or more transistors.

Isolating adjacent III-N transistors with at least two gaps, e.g., air-gaps, combines air isolation with CMOS compatible flows. Specifically there is been in evolution of air-gap technology, whereby sacrificial materials are placed for structural rigidity and then removed at the end of the process to reduce parasitic capacitance. This is typically been done in the BEOL but according to the present embodiments is implemented as part of the STI stack. Such a compatible approach combines the merits of III-N devices with silicon CMOS in modern silicon 300 millimeter semiconductor fabrication plants.

In both FIGS. 5A-5G and 6A-6F, the GaN substrate layer may be formed over any suitable underlying substrate or structure (not shown). In an embodiment, an underlying substrate is a silicon (111) substrate that represents a general workpiece object used to manufacture integrated circuits. The underlying substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The underlying substrate may also include semiconductor materials, metals, dielectrics, dopants, and other materials commonly found in semiconductor substrates.

The polarization layer 210 may include aluminum nitride (AlN), aluminum gallium nitride (AlGaN), indium aluminum nitride (InAlN), indium aluminum gallium nitride (InAlGaN), or any other suitable material, depending on the end use or target application. In the example structures shown in FIGS. 2A, 2B and 4, the gate stack may include a gate electrode and a gate dielectric formed directly under the gate electrode. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts.

Further, the gate electrode may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Various back end processes can also be performed, such as forming contacts 216 on the S/D regions 208 using, for example, a silicidation process (generally, deposition of contact metal and subsequent annealing).

The integrated circuit structures described herein may be included in an electronic device. As an example of one such apparatus, FIGS. 7A and 7B are top views of a wafer and dies that include one or more III-N transistors having CMOS compatible isolation structures, in accordance with one or more of the embodiments disclosed herein.

Figure 7B:
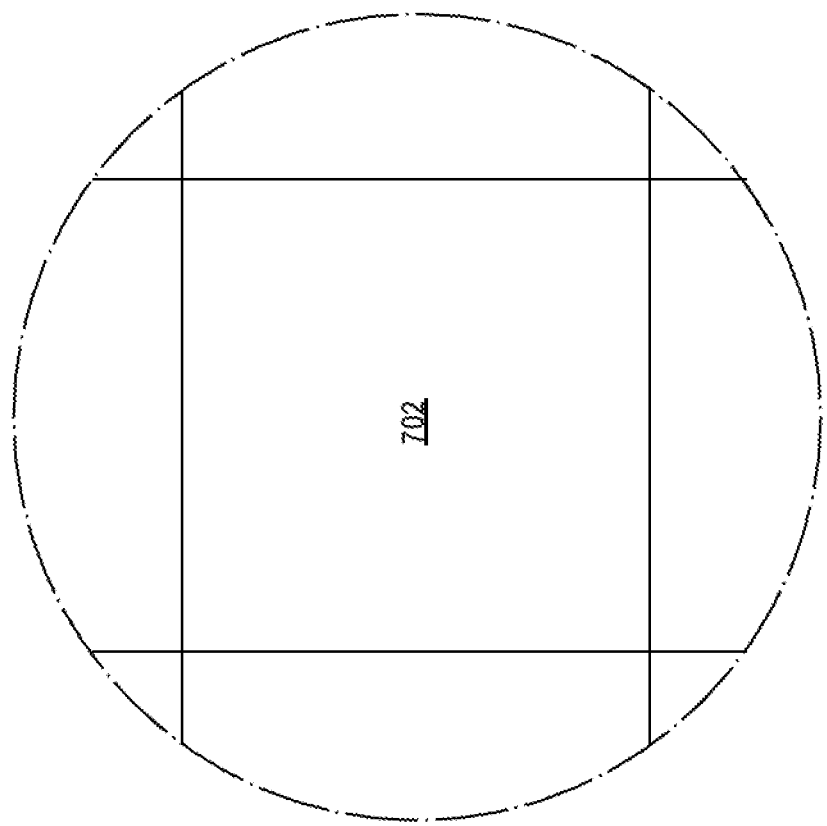
FIGS. 7A and 7B are top views of a wafer and dies that include one or more III-N transistors having CMOS compatible isolation structures, in accordance with one or more of the embodiments disclosed herein.
Figure 7A:
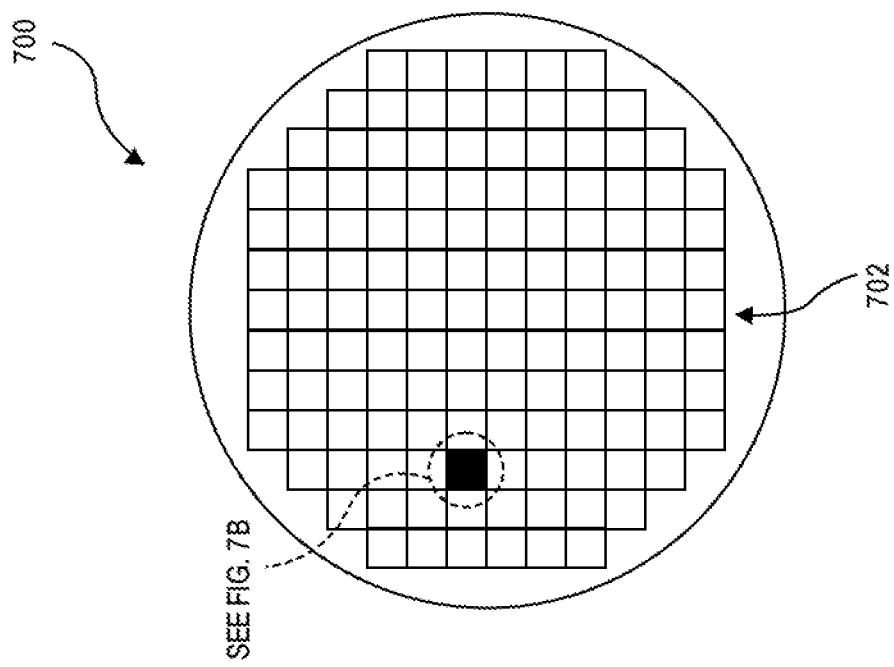

Referring to FIGS. 7A and 7B, a wafer 700 may be composed of semiconductor material and may include one or more dies 702 having integrated circuit (IC) structures formed on a surface of the wafer 700. Each of the dies 702 may be a repeating unit of a semiconductor product that includes any suitable IC (e.g., ICs including one or more III-N transistors having CMOS compatible isolation structures, such as described above. After the fabrication of the semiconductor product is complete, the wafer 700 may undergo a singulation process in which each of the dies 702 is separated from one another to provide discrete "chips" of the semiconductor product. In particular, structures that include embedded non-volatile memory structures having an independently scaled selector as disclosed herein may take the form of the wafer 700 (e.g., not singulated) or the form of the die 702 (e.g., singulated). The die 702 may include one or more embedded non-volatile memory structures based independently scaled selectors and/or supporting circuitry to route electrical signals, as well as any other IC components. In some embodiments, the wafer 700 or the die 702 may include an additional memory device (e.g., a static random access memory (SRAM) device), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
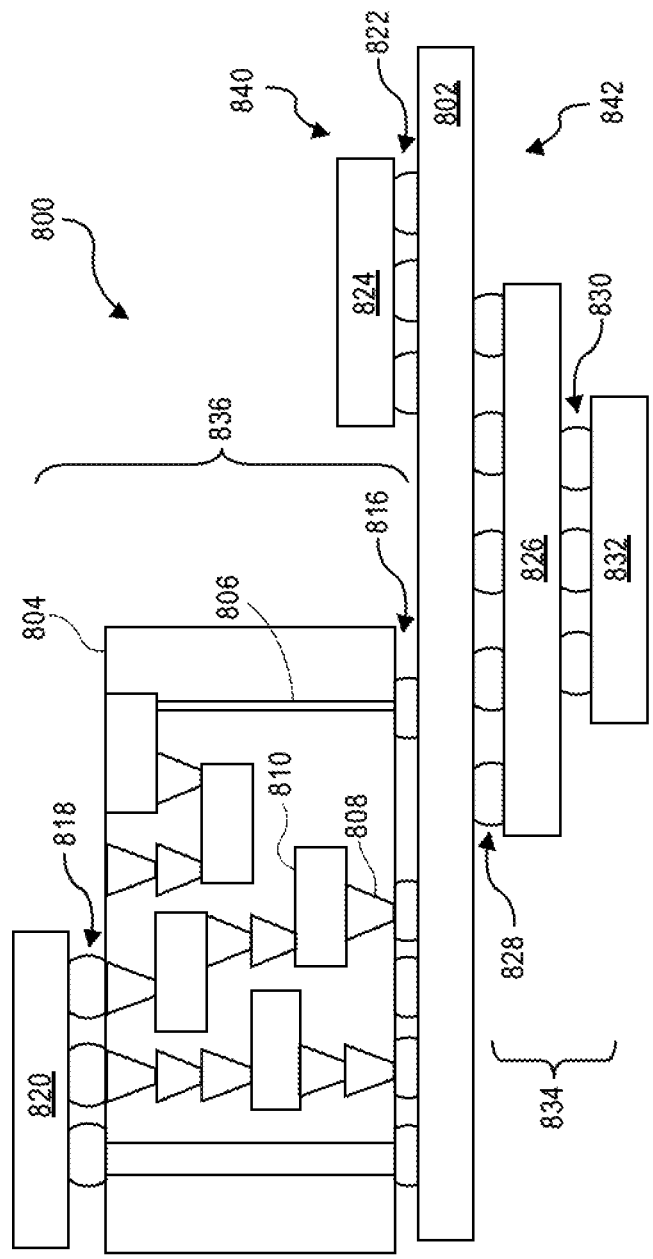
FIG. 8 is a cross-sectional side view of an integrated circuit (IC) device assembly that may include one or more III-N transistors having CMOS compatible isolation structures, in accordance with one or more of the embodiments disclosed herein.

FIG. 8 is a cross-sectional side view of an integrated circuit (IC) device assembly that may include one or more III-N transistors having CMOS compatible isolation structures, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of III-N transistors having CMOS compatible isolation structures, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
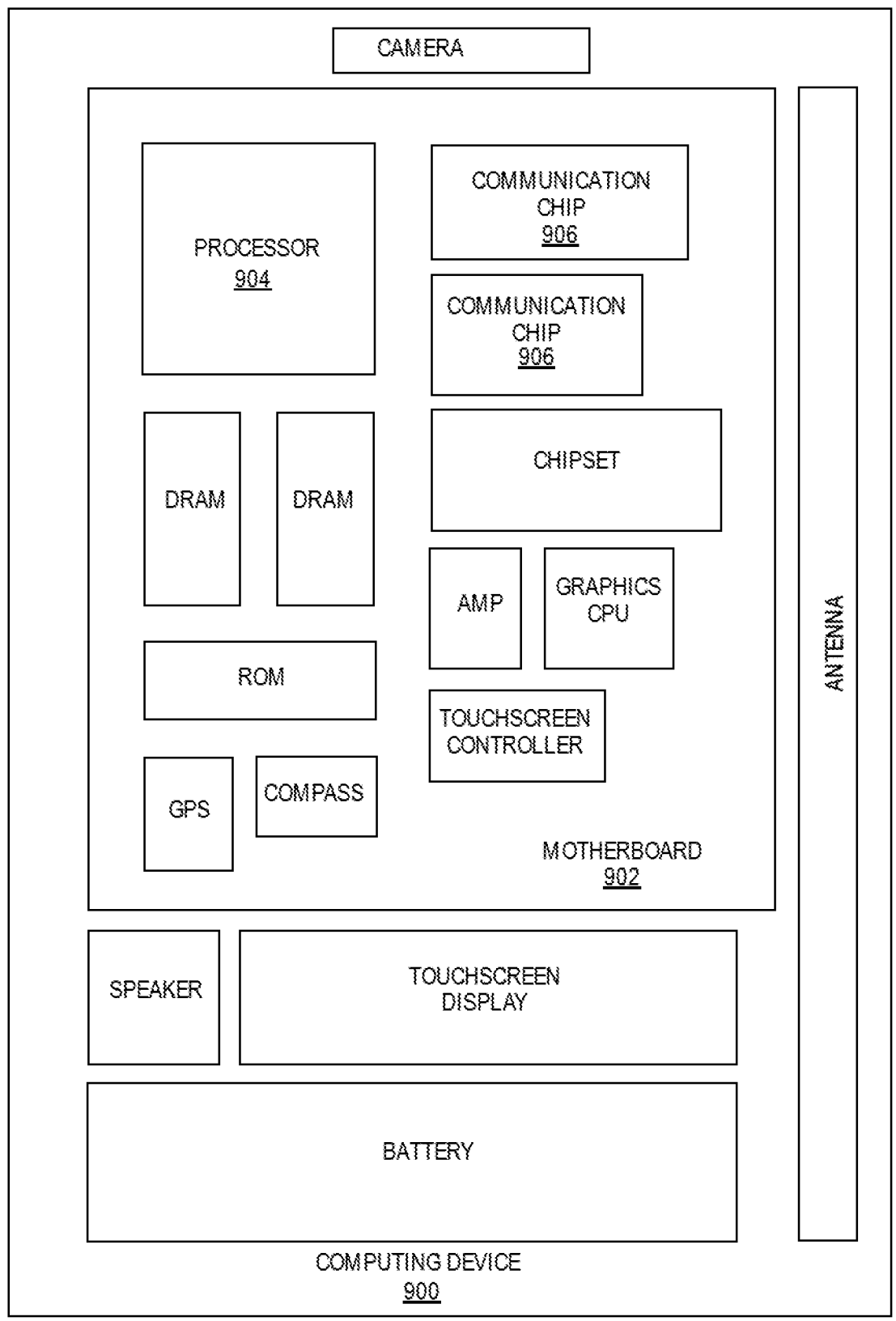
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more III-N transistors having CMOS compatible isolation structures, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more III-N transistors having CMOS compatible isolation structures, in accordance with implementations of embodiments of the disclosure.

In further implementations, another component housed within the computing device 900 may contain an integrated circuit die that includes one or more III-N transistors having CMOS compatible isolation structures, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include III-N transistors having CMOS compatible isolation structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a silicon substrate and a III-nitride (III-N) substrate over the silicon substrate. A first III-N transistor and a second III-N transistor is on the III-N substrate. An insulator structure is formed in the III-N substrate between the first III-N transistor and the second III-N, wherein the insulator structure comprises one of: a shallow trench filled with an oxide, nitride or low-K dielectric; or a first gap adjacent to the first III-N transistor and a second gap adjacent to the second III-N transistor.

Example embodiment 2: The integrated circuit structure of example embodiment 1, wherein the first III-N transistor and the second III-N transistor comprise gallium nitride (GaN) transistors.

Example embodiment 3: The integrated circuit structure of example embodiment 1 or 2, wherein the silicon oxide is coplanar with a top of metal contacts on the respective source and drain regions of the first III-N transistor and the second III-N transistor.

Example embodiment 4: The integrated circuit structure of example embodiment 1, 2, or 3, wherein the shallow trench is filled with a bi-layer stack comprising a high-K dielectric liner formed on the sidewalls and a bottom of the shallow trench, and the oxide, nitride or low-K dielectric formed on the layer of high-K dielectric and filling a remainder of the trench.

Example embodiment 5: The integrated circuit structure of example embodiment 4, wherein the high-K dielectric liner comprises one of aluminum oxide and hafnium oxide.

Example embodiment 6: The integrated circuit structure of example embodiment 4 or 5, wherein the high-K dielectric liner is approximately 2 nm in thickness.

Example embodiment 7: The integrated circuit structure of example embodiment 1, 2, 3, 4, 5, or 6, wherein a height of the shallow trench is approximately 200 nm to 500 nm.

Example embodiment 8: The integrated circuit structure of example embodiment 1, 2, 3, 4, 5, 6 or 7, wherein sides of the respective source and drain regions of the first III-N transistor and the second III-N transistor form sidewalls of the shallow trench.

Example embodiment 9: The integrated circuit structure of example embodiment 1, 2, 3, 4, 5, 6, 7 or 8, wherein the width of the shallow trench is approximately 300 nm to several microns.

Example embodiment 10: The integrated circuit structure of example embodiment 1, wherein the first gap is in contact with a source and drain region of the first III-N transistor and the second gap is in contact with a source drain region of the second III-N transistor, where the first gap and the second gap are separated by a dielectric material.

Example embodiment 11: The integrated circuit structure of example embodiment 10, wherein the first gap and the second gap are filled with gallium nitride (gan) transistor at least one of air, a gas, a dielectric, and a liquid.

Example embodiment 12: The integrated circuit structure of example embodiment 10 or 11, wherein the first gap and the second gap have respective top portions and bottom portions, wherein the top portions are located in an interlayer dielectric (ILD) at approximately ½ a height of the respective source and drain regions of the first III-N transistor and the second III-N transistor, and the bottom portions are located in the III-N substrate at approximately one half the depth of the III-N substrate such that the bottom portions do not contact the silicon substrate.

Example embodiment 13: The integrated circuit structure of example embodiment 10, 11, or 12, wherein the first gap and the second gap and are formed as an opening with borders defined by an interlayer dielectric (ILD) along a top portion and along a first side bordered by the III-N substrate along bottom portions; and bordered by both the source and drain regions and the III-N substrate along a second side.

Example embodiment 14: The integrated circuit structure of example embodiment 1, 2, 3, 4, 5, 6, 7, 8, 9, 10, 11, 12 or 13, wherein the first III-N transistor comprises source and drain regions, a polarization layer on the III-N substrate between the source and drain regions, and a gate electrode over the polarization layer.

Example embodiment 15: The integrated circuit structure of example embodiment 1, 2, 3, 4, 5, 6, 7, 8, 9, 10, 11, 12, 13 or 14, wherein the second III-N transistor comprises source and drain regions, a polarization layer on the III-N substrate between the source and drain regions, and a gate electrode over the polarization layer.

Example embodiment 16: A method of fabricating a gallium nitride (GaN) transistor comprises forming a GaN layer on a Si substrate and forming a polarization layer on the GaN layer. Shallow trench isolation is performed to etch the polarization layer and the GaN layer to define locations for isolation areas and adjacent source and drain regions. The trenches are filled with a dielectric material. A dummy gate is formed and spacers are formed on each side of the dummy gate are formed. Source and drain regions are formed adjacent to the trenches. An interlayer dielectric (ILD) is formed to a top of the dummy gate. The dummy gate is removed to expose a channel region and a replacement metal gate is formed over the exposed channel region. And metal contacts are formed in contact with the source and drain regions.

Example embodiment 17: The method of embodiment 16, wherein filling the trenches with a dielectric material further comprises: filling the trenches with dielectric material comprising an oxide, nitride or a low-K dielectric.

Example embodiment 18: The method embodiment of claim 16 or 17, further comprising filling the trenches such that the oxide, nitride or low-K dielectric is coplanar with a top of the metal contacts on the respective source and drain regions.

Example embodiment 19: The method of embodiment 16, 17 or 18, further comprising: lining the trenches with a high-K material and then filling with the trenches with at least one of aluminum oxide and hafnium oxide.

Example embodiment 20: The method of embodiment 16, 17, 18 or 19, wherein forming the source and drain regions further comprises: etching the polarization layer in the source and drain regions, followed by epitaxially regrowing n-type S/D material.

Example embodiment 21: The method of embodiment 16, 17, 18, 19 or 20, further comprising forming the shallow trench to a height of approximately 200 nm to 500 nm.

Example embodiment 22: A method of fabricating a gallium nitride (GaN) transistor comprises forming a GaN layer on a Si substrate and forming a polarization layer on the GaN layer. Shallow trench isolation is performed to etch the polarization layer and the GaN layer to define locations for isolation areas and adjacent source and drain regions. A sacrificial layer is formed in the trenches and etching the sacrificial layer to form spacers on sidewalls of the trenches. The remainder the trenches are filled with a interlayer dielectric (ILD). Formation of the GaN transistor to metal layer M0 is then completed. The spacers are etched from the sidewalls of the trenches to reveal respective gaps on each side of the GaN transistor.

Example embodiment 23: The method of embodiment 22, further comprising: filling the gaps with at least one of air, a gas, a dielectric, and a liquid.

Example embodiment 24: The method of embodiment 22 or 23, further comprising: forming the spacers such that once the spacers are removed the gaps are in contact with the source and drain regions of the GaN transistor.

Example embodiment 25: The method of embodiment 22, 23 or 24, further comprising: forming the spacers such that once the spacers are removed the gaps are formed as an opening with borders defined by ILD along a top portion and along a first side; bordered by the III-N substrate along bottom portions; and bordered by both the source and drain regions and the III-N substrate along a second side.

What is claimed is:

1. An integrated circuit structure, comprising:
   a silicon substrate;
   a III-nitride (III-N) substrate over the silicon substrate;
   a first III-N transistor and a second III-N transistor on the III-N substrate; and
   an insulator structure formed in the III-N substrate between the first III-N transistor and the second III-N transistor, wherein the insulator structure comprises one of:
      a shallow trench filled with an oxide, nitride or low-K dielectric, wherein the oxide, nitride or low-K dielectric is coplanar with a top of metal contacts on the respective source and drain regions of the first III-N transistor and the second III-N transistor; or
      a first gap adjacent to the first III-N transistor and a second gap adjacent to the second III-N transistor, wherein the first gap is in contact with a source and drain region of the first III-N transistor and the second gap is in contact with a source drain region of the second III-N transistor, where the first gap and the second gap are separated by a dielectric material.

2. The integrated circuit structure of claim 1, wherein the first gap and the second gap are filled with at least one of air, a gas, a dielectric, and a liquid.

3. The integrated circuit structure of claim 1, wherein the first gap and the second gap have respective top portions and bottom portions, wherein the top portions are located in an interlayer dielectric (ILD) at approximately ½ a height of the respective source and drain regions of the first III-N transistor and the second III-N transistor, and the bottom portions are located in the III-N substrate at approximately one half a depth of the III-N substrate such that the bottom portions do not contact the silicon substrate.

4. The integrated circuit structure of claim 1, wherein the first gap and the second gap and are formed as an opening with borders defined by an interlayer dielectric (ILD) along a top portion and along a first side bordered by the III-N substrate along bottom portions; and bordered by both the source and drain regions and the III-N substrate along a second side.

5. The integrated circuit structure of claim 1, wherein the first III-N transistor comprises source and drain regions, a polarization layer on the III-N substrate between the source and drain regions, and a gate electrode over the polarization layer.

6. The integrated circuit structure of claim 1, wherein the second III-N transistor comprises source and drain regions, a polarization layer on the III-N substrate between the source and drain regions, and a gate electrode over the polarization layer.

7. The integrated circuit structure of claim 1, wherein the first III-N transistor and the second III-N transistor comprise gallium nitride (GaN) transistors.

8. The integrated circuit structure of claim 1, wherein the shallow trench is filled with a bi-layer stack comprising a high-K dielectric liner formed on the sidewalls and a bottom of the shallow trench, and the oxide, nitride or low-K dielectric formed on the high-K dielectric and filling a remainder of the shallow trench.

9. The integrated circuit structure of claim 8, wherein the high-K dielectric liner comprises one of aluminum oxide and hafnium oxide.

10. The integrated circuit structure of claim 8, wherein the high-K dielectric liner is approximately 2 nm in thickness.

11. The integrated circuit structure of claim 1, wherein the shallow trench extends into the III-N substrate to a depth of approximately 200 nm to 500 nm.

12. The integrated circuit structure of claim 1, wherein sides of the respective source and drain regions of the first III-N transistor and the second III-N transistor form sidewalls of the shallow trench.

13. The integrated circuit structure of claim 1, wherein a width of the shallow trench is approximately 300 nm to several microns.

* * * * *